(12) United States Patent
Perea et al.

(10) Patent No.: US 6,287,936 B1
(45) Date of Patent: Sep. 11, 2001

(54) METHOD OF FORMING POROUS SILICON IN A SILICON SUBSTRATE, IN PARTICULAR FOR IMPROVING THE PERFORMANCE OF AN INDUCTIVE CIRCUIT

(75) Inventors: Ernesto Perea, Montbonnot; Guillermo Bomchil, Seyssins; Aomar Halimaoui, Grenoble, all of (FR)

(73) Assignees: STMicroelectronics S.A., Gentilly; France Telecom, Paris, both of (FR)

( * ) Notice: Subject to any disclaimer, the term of this patent is extended or adjusted under 35 U.S.C. 154(b) by 0 days.

(21) Appl. No.: 09/304,887

(22) Filed: May 4, 1999

(30) Foreign Application Priority Data

May 19, 1998 (FR) .................................. 98 06282

(51) Int. Cl.[7] .................................................. H01L 21/76
(52) U.S. Cl. ........................................... 438/409; 438/757
(58) Field of Search .................................. 438/409, 456, 438/459, 479, 745, 750, 753, 756, 974, 977, 757

(56) References Cited

U.S. PATENT DOCUMENTS

| | | | |
|---|---|---|---|
| 4,057,823 | 11/1977 | Burkhardt et al. | 357/52 |
| 4,990,988 | 2/1991 | Lin | 357/30 |
| 5,360,759 | * 11/1994 | Stengl et al. | 437/20 |
| 5,458,735 | * 10/1995 | Richter et al. | 156/662.1 |
| 5,466,631 | * 11/1995 | Ichikawa et al. | 437/62 |
| 5,501,787 | * 3/1996 | Bassous et al. | 205/124 |
| 6,103,590 | * 8/2000 | Swanson et al. | 438/409 |

FOREIGN PATENT DOCUMENTS

| | | |
|---|---|---|
| 0 563 625 A2 | 3/1993 | (EP) . |
| 1 515 953 | 3/1976 | (GB) . |
| 09270515 | 10/1997 | (JP) . |

OTHER PUBLICATIONS

Aono et al., Basic Properties of Anodized Porouss Silicon Formed Under Uniform Current Density, Apr. 1994, *Electronics and Communications in Japan*, Part 2, vol. 77, No. 4, pp. 97–105.

Unno et al., Dissolution Reaction Effect on Porous–Silicon Density, Mar. 1987, *Journal of the Electrochemical Society/ Solid–State Science and Technology*, pp. 645–648.

Nam et al., High–Performance Planar Inductor on Thick Oxidized Porous Silicon (OPS) Substrate, Aug. 1997, *IEEE Microwave and Guided Wave Letters*, vol. 7, No. 8, Aug., pp., 236–238.

* cited by examiner

*Primary Examiner*—David Nelms
*Assistant Examiner*—Quoc Hoang
(74) *Attorney, Agent, or Firm*—Theodore E. Galanthay; Allen, Dyer, Doppelt, Milbrath & Gilchrist, P.A.

(57) ABSTRACT

The method is for forming porous silicon in a silicon substrate, in particular for improving the quality factor of an inductive circuit produced on a silicon semiconductor wafer which also incorporates integrated transistors. The rear face of the wafer, already incorporating the transistors and the inductive circuit on its front face, is placed in contact with an acid electrolyte containing hydrofluoric acid and at least one other acid. An anodic oxidation of the silicon of the wafer at the rear face is carried out so as to convert this silicon into porous silicon over a predetermined height from the rear face which is in contact with the electrolyte.

34 Claims, 3 Drawing Sheets

METHOD OF FORMING POROUS SILICON IN A SILICON SUBSTRATE, IN PARTICULAR FOR IMPROVING THE PERFORMANCE OF AN INDUCTIVE CIRCUIT

FIELD OF THE INVENTION

The invention relates to semiconductor processing, and, more particularly, to the formation of porous silicon in a silicon substrate, and which may be applied advantageously, but without implying any limitation, to the production of inductive circuits produced in integrated form on a silicon substrate.

BACKGROUND OF THE INVENTION

Inductive circuits are an essential component of radio frequency circuits which are used particularly in the field of mobile telephones. An inductive circuit is an element of an inductive/capacitive tuned resonant circuit. Inductive/capacitive tuned circuits are, in particular, used in tuned radio frequency amplifiers (generally bandpass radio frequency amplifiers).

One particularly sensitive feature of these amplifiers resides in the selectivity of the inductive/capacitive resonant circuit. This is so since outside the working frequency band of the amplifier, all the other spectral components are considered as noise. Conventionally, the frequency response of an inductive/capacitive tuned amplifier contains a peak which is centered on the resonant frequency FO and has a width at the half-height commonly denoted by $\Delta f$. The resonant frequency FO is equal to the inverse of the square root of the product of the inductance times the capacitance.

The ratio FO/$\Delta f$ is referred to as the "quality factor" of the inductive/capacitive resonant circuit. In the rest of the text, and by a convenient oversimplification, the term "quality factor" will be associated with the inductive circuit on its own. This quality factor should be as high as possible. However, the width $\Delta f$ of the resonance peak is directly proportional to the energy losses of the resonant circuit. Consequently, the higher the losses are, the more the quality factor is reduced.

On a silicon substrate, the inductive circuits are produced by forming a metal spiral which rests on the silicon on an insulating layer, typically silicon dioxide having, for example, a thickness of 1 micron. However, unlike gallium arsenide (GaAs) semiconductor substrates, silicon substrates have low resistivity. The result of this is consequently that the magnetic field generated by the flow of current in the metal turns induces very high eddy currents in the underlying silicon substrate. Some of the energy of this magnetic field will therefore be dissipated in the form of heat, consequently reducing the value of the quality factor.

To address this problem, it has in particular been proposed to use inductive circuits with a high quality factor which are external to the integrated circuit containing the other elements of the tuned amplifier. Notwithstanding, such an approach requires extra components and support which are incompatible with low production costs. Furthermore, stray interference can impair the operation of the amplifier, in particular because of the interconnections between the integrated circuit and the external inductive circuit.

It has therefore been found particularly advantageous to arrange all the components of the radio frequency amplifier, and, in particular, all the passive components, such as inductors and capacitors, in the same integrated circuit. In this regard, it has been proposed to make selective localized substrate recesses under the inductor zones. This is done by localized chemical attack or etching, particularly using potassium hydroxide (KOH).

Unfortunately, such an approach requires specific infrared masks arranged on the rear face of the substrate whose alignment with the components arranged on the front face is particularly difficult. It also entails problems in coating the chip with resin, because of the presence of these relatively large cavities in the substrate.

Another advocated approach includes fully removing the silicon substrate and replacing it with a glass substrate. This approach also has a large number of drawbacks, in particular because of the difference between the expansion coefficients of silicon and the glass, the fragility of the substrate, and the difficulty of welding and coating the chip with resin.

It has further been proposed, in an article by Y. H. Xie et al., entitled "An Approach For Fabricating High Performance Inductors On Low Resistivity Substrates", IEEE BCTM 5.3, September 1997, pp. 88–91, to produce an inductive circuit on a silicon substrate which is partly porous, so as to increase its resistivity. More precisely, a silicon substrate, typically having a thickness of 300 microns, is subject to anodic oxidation in an aqueous solution of hydrofluoric acid having a concentration of 20% by volume with an anodic current density equal to 50 mA/cm$^2$. This makes the silicon porous to a thickness between 50 and 250 microns. An insulating layer of silicon dioxide is then deposited on the outer surface of the substrate, and covered with a metal spiral so as to form the inductive circuit.

However, the method described in this prior art document is applicable only to the production of an inductive circuit. It is unsuitable for the simultaneous production, on the same porous silicon substrate, of other active components, such as, for example, bipolar transistors and/or complementary field-effect transistors with insulated gates (CMOS transistors). These are typically needed for producing the other elements of an integrated tuned radio frequency amplifier. Indeed, this document indicates that the internal surface of the pores of the porous silicon is a strong source of contamination. This is so in particular for the gas atmospheres of the ovens which would be used to produce the bipolar or CMOS transistors on this same porous silicon substrate. What is more, further to these problems of contamination, the porous silicon undergoes surface deformations when hot, and this is particularly unsuitable for the production of bipolar and/or CMOS transistors prior to this phase of converting silicon into porous silicon.

SUMMARY OF THE INVENTION

The object of the invention is to provide a more satisfactory approach to the problems described above.

One object of the invention is to reduce the eddy-current losses in the underlying substrate in an inductive circuit produced in integrated form in an integrated circuit which also includes integrated transistors, this integrated circuit being produced on a silicon semiconductor wafer. The quality factor of the inductive circuit is then increased.

The invention is directed to a method of reducing the eddy-current losses of an inductive circuit produced on a silicon semiconductor wafer which also incorporates integrated transistors, in which the rear face of the wafer, already incorporating the transistors and the inductive circuit on its front face, is placed in contact with an acid electrolyte containing hydrofluoric acid and at least one other acid. Anodic oxidation of the silicon of the wafer at the rear face is carried out so as to convert this silicon into porous silicon over a predetermined height (thickness) from the rear face which is in contact with the electrolyte.

In other words, according to the invention, the conversion of the silicon of the substrate into porous silicon is carried out after the substrate has undergone all the conventional treatments for producing the transistors and the various circuits, such as, for example, by using conventional CMOS or biCMOS (bipolar-CMOS) technology. A post-treatment of the silicon is therefore carried out, on a wafer already equipped at the front face with the various integrated circuits containing the various transistors and inductive circuits. This is contrasted to a preconversion of silicon into porous silicon carried out on a virgin wafer.

Notwithstanding, the thickness of the semiconductor wafers customarily used is on the order of several hundred microns. However, the electrolytes customarily used to carry out anodic oxidations of silicon have hydrofluoric acid concentrations generally less than 35% and furthermore contain ethanol. Ethanol provides a surfactant allowing the surface tension of the electrolyte to be reduced, thus promoting the elimination of the hydrogen bubbles resulting from the anodic oxidation with a view to obtaining better uniformity of the attack on the silicon. However, with such electrolytes, the values of anodic current density which can be applied must remain low enough to avoid the phenomenon of electropolishing the silicon, which leads to erosion of the substrate.

This therefore results in rates of conversion of silicon into porous silicon which are lower than 10 microns/minute, which leads, for large wafer thicknesses, to immersion of its rear face for an extremely long time, typically more than an hour. The risk of chemically dissolving the silicon increases as the value of the pH of the electrolyte rises. Accordingly, another aspect of the invention therefore provides for carrying out the anodic oxidation in an electrolyte including hydrofluoric acid and at least one other acid so as to reduce the value of the pH of the electrolyte. This makes it possible to increase the anodic current density, and consequently the rate of conversion of silicon into porous silicon, while reducing the risk of chemically dissolving the silicon. In this regard, any acid may be employed, in particular hydrochloric acid or sulphuric acid.

In theory, the hydrogen bubbles could be removed by vigorous mechanical agitation of the electrolyte. However, such an approach is less effective and may lead to attack non-uniformities thereby resulting in less of an improvement in the quality factor. This is the reason why, in certain applications, it is particularly preferable to add a surfactant to the electrolyte.

What is more, it is particularly advantageous in this regard to use acetic acid as the other acid. This is because it has been observed that acetic acid is also a good surfactant, making it possible to reduce the surface tension of the electrolyte, and therefore to promote the elimination of the hydrogen bubbles resulting from the anodic oxidation.

The invention is in this regard noteworthy in that acetic acid makes it possible, on the one hand, in combination with hydrofluoric acid, to reduce the pH of the electrolyte, consequently allowing the anodic current density to be increased to values which, for example, may be as high as 300 mA/cm$^2$. At the same time, the acetic acid avoids the phenomenon of electropolishing. And on the other hand, the acetic acid avoids the use of ethanol which would have the precise result of increasing the pH, (that is to say reducing the acidity) which would be contrary to the desired effect.

For example, use may be made of a hydrofluoric acid concentration at least on the order of 40% by weight, to which acetic acid may be added in a concentration on the order of 5% by weight. It will be noted here that, since the surfactant properties of acetic acid are very good, only a small percentage by weight may be used.

In general, the pH of the electrolyte, as well as the value of the anodic current density, may advantageously be chosen in such a way as to obtain, without electropolishing of the silicon, a rate of formation of the porous silicon in excess of 20 microns/minute with a final porosity of less than 70% void space. By way of explanation, it has been observed that a final porosity value in excess of 70% by volume could lead to greater weakening of the substrate.

For example, use may be made of an electrolyte whose pH is less than 1, for example, close to zero, or even negative, with an anodic current density at least equal to 150 mA/cm$^2$, for example equal to 300 mA/cm$^2$. Thus, by way of example, an electrolyte formed by an aqueous solution containing 40% by weight hydrofluoric acid and 5% by weight acetic acid, leads, with an anodic current density of 300 mA/cm$^2$, to a growth rate of the porous silicon of the order of 20 micron/min and to a final porosity on the order of 60% void space.

Such a growth rate can also be obtained with an electrolyte formed by an aqueous solution of hydrofluoric acid at a concentration of 45% by weight, to which acetic acid has been added at a concentration of less than 5%, and to which a small amount of another acid, for example hydrochloric acid, has also been added.

Another characteristic of the invention resides in the fact that the conversion of the silicon into porous silicon should be carried out over a predetermined height (thickness). This being in particular with a view to avoiding attack on the silicon layer which is arranged in the vicinity of the front face of the wafer and in which the various active zones of the other components, such as the transistors, are produced. It might be possible to determine this height of porous silicon by stopping the anodic oxidation after a predetermined time, taking into account the growth rate of the porous silicon as measured, for example, during a calibration phase. However, it is particularly advantageous to measure the potential difference (voltage) between the anode and another electrode arranged in the electrolyte (the cathode or another reference electrode) and to use this measurement of potential difference to determine the time at which to terminate the anodic oxidation. More precisely, this anodic oxidation is carried out by applying a constant anodic current. The anodic oxidation is then advantageously stopped when an increase in the potential difference is detected.

By way of explanation, the transistors which are produced generally include buried layers having heavy doping, for example, of the N$^+$ type, or alternatively N type implanted zones. Furthermore, P$^+$ type insulation zones make it possible to insulate two adjacent transistors, and may also be found in the substrate. What is more, when the wafer is, for example, P type silicon, an increase in the resistance takes place consistent with a P-N junction or a P-P$^+$ junction. Consequently, since the operation has been carried out at constant current, an increase in the potential difference between the anode and the other electrode indicates that the electrolyte has reached the PN junction and that this anodic oxidation should therefore be terminated.

Merely using this porous silicon obtained as such after the anodic oxidation gives a significant increase in the quality factor. Notwithstanding, it may in certain cases be desirable to stabilize the porous silicon by oxidation and thus avoid possible modifications of the material. Stabilization treatments using moderate thermal oxidation are already known. However, because of the presence of the circuits (transistors and the like) already produced on the wafer, the choice of the temperature proves particularly critical. This is so because it must be low enough not to damage the circuits and also to prevent any contamination of the oxidation ovens. This is the reason why the invention proposes to carry out, after the step of forming porous silicon, a treatment of stabilizing the porous silicon with chemical or electrochemical oxidation.

Further to the application to inductive circuits produced in integrated form on silicon, which has just been discussed, other applications of the invention may be envisaged. Such may include, in particular the production within a silicon substrate, of particularly thick insulating zones formed by oxidized porous silicon which thus make it possible to insulate certain regions of the substrate from others.

The invention therefore also proposes a method of forming porous silicon in a silicon substrate by anodic oxidation of the substrate in contact with an acid electrolyte containing hydrofluoric acid. According to a general characteristic of the invention, the electrolyte furthermore contains at least one other acid, and advantageously acetic acid which then provides both the other acid and also a surfactant.

BRIEF DESCRIPTION OF THE DRAWINGS

Other advantages and characteristics of the invention will become apparent while studying the detailed description of an entirely non-limiting embodiment, and the appended drawings in which.

DETAILED DESCRIPTION OF THE PREFERRED EMBODIMENTS

Figure 1:
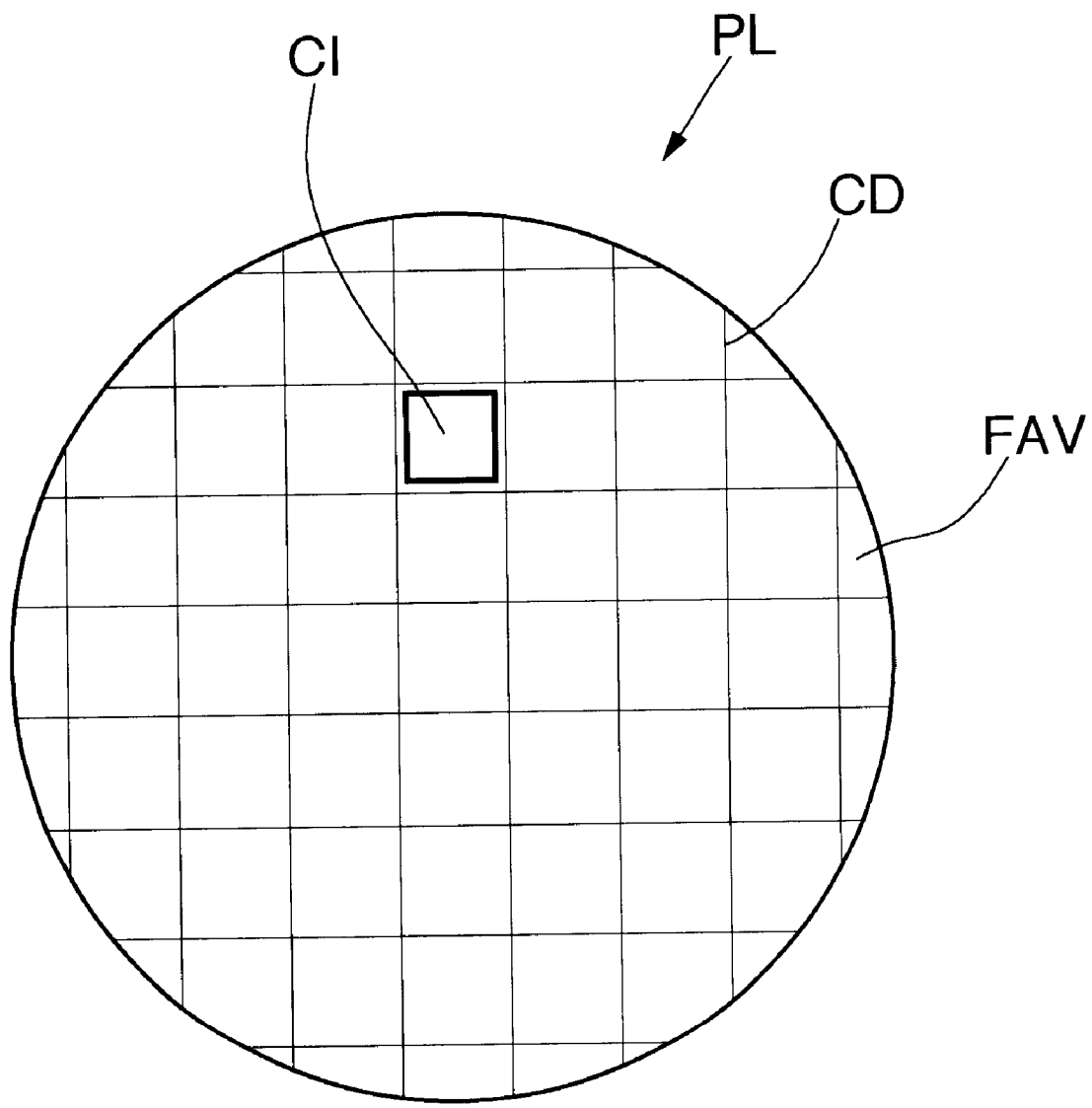
FIG. 1 is a schematic view of the front face of a silicon wafer.

In FIG. 1, the reference PL denotes a circular silicon semiconductor wafer, having, for example, a diameter of 200 mm, and typically having a thickness on the order of 500 microns. The various integrated circuits (chips) CI are produced on predetermined zones of the front face FAV of this semiconductor wafer PL. These zones are delimited by cutting tracks or streets CD along which the wafer will subsequently be sawed to mutually separate the integrated circuits which are produced.

Figure 2:
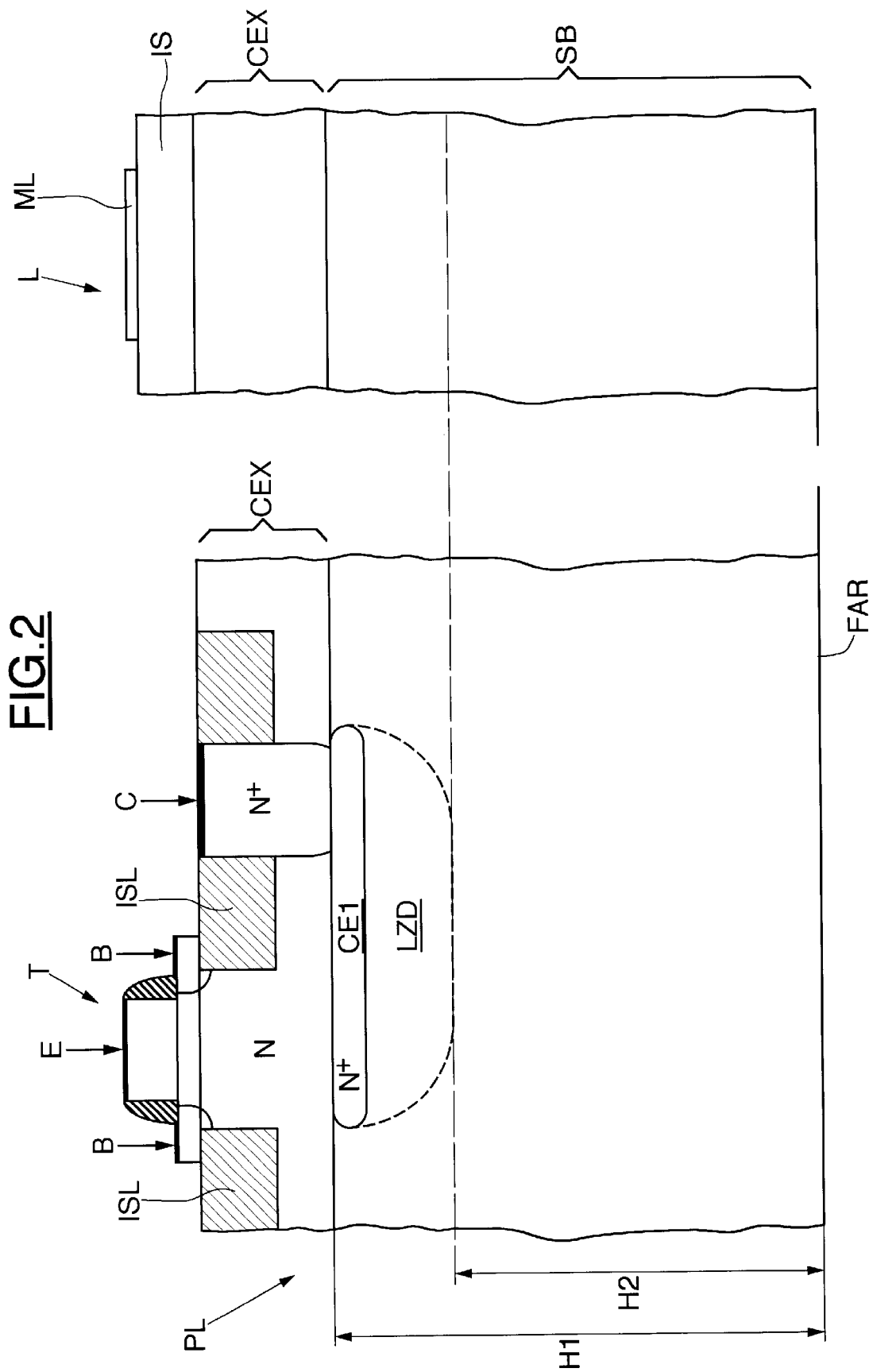
FIG. 2 schematically illustrates a part of a slice of the wafer which will, using the method according to the invention, undergo anodic oxidation at the rear face in contact with an acid electrolyte, and FIG. 3 schematically illustrates an electrochemical cell for implementing the method according to the invention.

It is assumed here that each integrated circuit CI includes bipolar and/or CMOS transistors as well as inductive circuits. For the sake of simplicity, FIG. 2 represents a single bipolar transistor T and a single inductive circuit L.

More precisely, in the non-limiting example which is illustrated, the formation of the bipolar transistor T includes epitaxial growth of an N type silicon layer CEX on the upper surface of the initial silicon substrate SB within which an $N^+$ type buried layer CE1 has been implanted beforehand. Side insulation zones, as well as an offset collector well C, were then produced. The base B was then epitaxially grown on the intrinsic collector and the emitter E was formed.

The inductive circuit L results, for example, from the formation on the epitaxial layer CEX of a thick insulating layer IS, typically on the order of 1000 Å. On top of this insulating layer IS there is a metal spiral ML obtained by connecting a metallization level of the integrated circuit.

Of course, it might have been envisaged to produce the active zones of the transistors not by epitaxy but by implantation of the corresponding zones in the initial substrate SB. In this case, the insulating layer IS supporting the metallization ML of the inductive circuit L would rest directly on the P type substrate SB.

Figure 3:
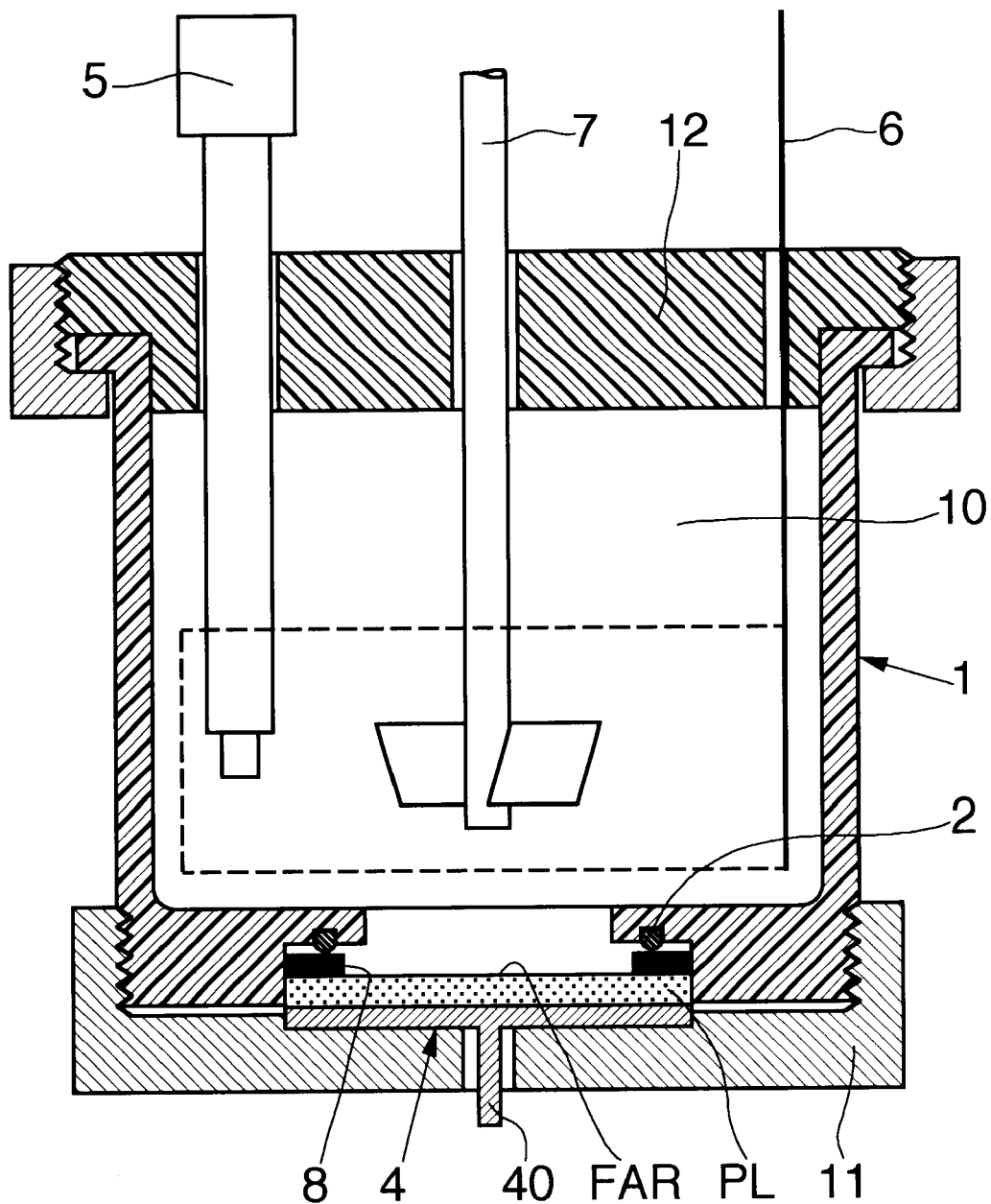

The wafer PL including the integrated circuit which has been produced is then placed in an electrochemical cell, for example of the type schematically illustrated in FIG. 3. This electrochemical cell has a tank 1 containing an electrolyte 10 in contact with the rear face FAR of the wafer PL. This wafer PL is sandwiched between a metal plate 4, in contact with the front face of the wafer, and a peripheral seal 2. The peripheral seal 2 is in contact with the rear face of the wafer and rests on a wall shoulder of the tank.

In the case when the intention is to carry out an anodic oxidation only of the central zone of the rear face of the wafer PL, for example, because the integrated circuits containing the inductive circuits are only located in this central zone, a mask 8 could then be interposed between the seal and the rear face of the wafer. The metal plate 4 is fixed on the bottom of the tank by a threaded plug 11 which has a central orifice allowing a pad 40 to be passed through for making electrical contact.

This metal plate provides the anode. This anode has to be in electrical contact with the underlying silicon substrate. In this regard, one way of making such a metal contact includes using the substrate contact pads which exist in all the integrated circuits produced and which connect the underlying silicon substrate to the surface of the integrated circuit. All the substrate contacts may then, for example, be short-circuited by using a metal layer, for example a silver paste, which can then be easily removed by dissolving in an organic solvent once the anodic oxidation is completed. Instead of silver paste, use could also be made of the last metallization level before etching. Of course, any other conventional technique can be used to make this anodic contact. For example, the anodic contact can be made by a conventional technique based on the use of an anodic electrolytic contact.

The cathode includes here a platinum grid 6 which is immersed in the electrolyte 10 and emerges out of the tank through an orifice formed in the upper closure plug 12 of this tank. A mechanical stirrer 7, and another electrode 5 which is immersed in the electrolyte and is used as a reference electrode, are also advantageously provided. Although, for the sake of simplicity, this is not represented in FIG. 3, this reference electrode may thus be arranged very close to the rear face of the wafer so as to obtain, as will be seen in more detail below, greater accuracy in measuring the potential difference measured between the anode 4 and this reference electrode 5.

According to one embodiment of the method according to the invention, an electrolyte 10, formed by an aqueous solution of hydrofluoric acid and acetic acid is used. The hydrofluoric acid concentration is 40% by weight, while that of the acetic acid is 5% by weight. The pH of such an electrolyte is then below 0.1. A voltage is applied between the anode and the electrode so as to make a constant anodic current flow, corresponding to an anodic current density equal to 300 $mA/cm^2$. The rate of conversion of the silicon into porous silicon is then on the order of 20 microns/minute and the final porosity obtained is on the order of 60%.

Although acetic acid serves as a very good surfactant, to facilitate the removal of the hydrogen bubbles further, gentle mechanical agitation may optionally be carried out using the stirrer 7.

The anodic oxidation is continued until the height of porous silicon, calculated from the rear face FAR, reaches the value H2 (FIG. 2). In fact, although a relatively thin $N^+$ doped layer CE1 has been represented, for the sake of simplicity, the person skilled in the art will understand that the zone LZD actually doped extends deeper into the substrate with a doping profile which decreases when moving into the substrate. The height H2 therefore corresponds to the N doping limit, that is to say the appearance of the PN junction. At this moment, the resistance increases and, since the operation has been carried out at constant current, this leads to an increase in the voltage between the anode and the electrode. The anodic oxidation is then stopped by cutting off the current.

A porous silicon zone extending over a height H2 is thus finally obtained. Even if the difference between the height H1 (initial height of the wafer PL or substrate SB) and the height H2 is on the order of a few tens of microns, a porous silicon extending over several tens of microns is obtained, and this on its own leads to a substantial improvement of the quality factor, typically a 50% increase. Furthermore, destruction of the other active components produced on the integrated circuit should be avoided.

Another usable electrolyte, allowing a growth rate which is also on the order of 20 microns/minute with a final porosity of the order of 60%, may include an aqueous solution of hydrofluoric acid at a concentration of 45% by weight, acetic acid at a concentration of less than 5% by weight, and a small amount of another acid. The other acid, for example, may be hydrochloric acid at a concentration of 1 mole per liter. The pH of such an electrolyte is then lower than 0.01.

Other acid electrolytes may be employed, for example, by using hydrofluoric acid and any other acid, such as sulphuric acid, preferably in combination with acetic acid. In general, the pH of the electrolyte, as well as the value of the anodic current density, can be chosen in such a way as to obtain, without electropolishing the silicon, a rate of formation of porous silicon in excess of 10 microns/minute. The limit values for anodic current density, in particular taking the pH of the electrolyte into account, which make it possible to avoid electropolishing the silicon are well-known to the person skilled in the art and have formed the subject-matter of a number of publications. These publications include, for example, the thesis by Claude BERTRAND entitled "Préparation et caractérisation du silicium poreux obtenue sur substrata P et N" [Preparation and characterization of porous silicon obtained on P and N substrates] defended on Apr. 10, 1986 and available from l' Institut National Polytechnique de Grenoble (France).

Once this anodic oxidation has been completed, stabilization of the porous silicon obtained is advantageously carried out by chemical or electrochemical oxidation. If chemical oxidation is used, the porous silicon may be arranged in a 4/4/2 by volume solution of SO4H2/H2O2/CH3COOH (sulphuric acid/hydrogen peroxide/acetic acid) for a time of the order of 10 minutes.

For electrochemical oxidation (anodic oxidation), the porous silicon will then be arranged in an electrochemical cell of the type illustrated in FIG. 3. This cell, as electrolyte, contains a 1 mole/liter strength aqueous solution of HCl. In this case, the anodic current density used is on the order of 10 $mA/cm^2$ over a time of 15 minutes.

That which is claimed is:

1. A method for improving a quality factor of an inductive circuit on a front face of a silicon semiconductor wafer which also incorporates integrated transistors, the method comprising the steps of:

placing a rear face of the wafer in contact with an acid electrolyte containing hydrofluoric acid and at least one other acid; and carrying out anodic oxidation of silicon at the rear face to convert the silicon into porous silicon over a predetermined height from the rear face which is in contact with the electrolyte.

2. A method according to claim 1, wherein the electrolyte also contains a surfactant.

3. A method according to claim 1, wherein the at least one other acid is also a surfactant.

4. A method according to claim 1, wherein the at least one other acid and is acetic acid.

5. A method according to claim 4, wherein the acetic acid is in a concentration on an order of about 5% by weight.

6. A method according to claim 1, wherein the hydrofluoric acid is in a concentration on an order of about 40% by weight.

7. A method according to claim 1, wherein at least one of a pH of the electrolyte and a value of anodic current density is selected to obtain a predetermined rate of formation of the porous silicon.

8. A method according to claim 7, wherein at least one of a pH of the electrolyte and a value of anodic current density are selected so that the predetermined rate of formation is greater than about 10 microns/minute.

9. A method according to claim 1, wherein at least one of a pH of the electrolyte and a value of anodic current density is selected to avoid electropolishing of the silicon.

10. A method according to claim 1, wherein at least one of a pH of the electrolyte and a value of anodic current density is selected to produce a final porosity of less than about 70% void space.

11. A method according to claim 1, wherein a pH of the electrolyte is selected to be less than about 1.

12. A method according to claim 1, wherein an anodic current density is selected to be at least equal to about 150 $mA/cm^2$.

13. A method according to claim 1, further comprising the steps of:

applying a constant anodic current for carrying out the anodic oxidation;

measuring a potential difference between first and second electrodes arranged in the electrolyte; and stopping the anodic oxidation when an increase in the potential difference is detected.

14. A method according to claim 1, wherein the semiconductor wafer comprises contact pads; and wherein the step of carrying out anodic oxidation comprises applying an anodic current using the contact pads.

15. A method according to claim 14, further comprising the step of short-circuiting all contact pads with a metal layer prior to applying the anodic current.

16. A method according to claim 1, further comprising the step of stabilizing the porous silicon by at least one of chemical and electrochemical oxidation after forming the porous silicon.

17. A method for improving a quality factor of an inductive circuit on a front face of a silicon semiconductor wafer which also incorporates integrated transistors, the method comprising the steps of:

placing a rear face of the wafer in contact with an acid electrolyte containing hydrofluoric acid and at least one other acid;

carrying out anodic oxidation of silicon at the rear face by applying a constant anodic current to convert the silicon into porous silicon;

measuring a potential difference between first and second electrodes arranged in the electrolyte; and stopping the anodic oxidation when an increase in the potential difference is detected.

18. A method according to claim 11, wherein the at least one other acid and is acetic acid.

19. A method according to claim 18, wherein the acetic acid is in a concentration on an order of about 5% by weight.

20. A method according to claim 17, wherein the hydrofluoric acid is in a concentration on an order of about 40% by weight.

21. A method according to claim 19, wherein at least one of a pH of the electrolyte and a value of anodic current density are selected so that a rate of formation of porous silicon is greater than about 10 microns/minute.

22. A method according to claim 17, wherein at least one of a pH of the electrolyte and a value of anodic current density is selected to produce a final porosity of less than about 70% void space.

23. A method according to claim 17, wherein a pH of the electrolyte is selected to be less than about 1; and wherein an anodic current density is selected to be at least equal to about 150 $mA/cm^2$.

24. A method according to claim 17, wherein the semiconductor wafer comprises contact pads; and wherein the step of applying the constant anodic current uses the contact pads.

25. A method according to claim 24, further comprising the step of short-circuiting all contact pads with a metal layer prior to applying the constant anodic current.

26. A method according to claim 17, further comprising the step of stabilizing the porous silicon by at least one of chemical and electrochemical oxidation after forming the porous silicon.

27. A method for forming porous silicon on a silicon wafer comprising the steps of:

placing the silicon wafer in contact with an acid electrolyte containing hydrofluoric acid and at least one other acid;

selecting at least one of a pH of the electrolyte and a value of anodic current density to be within a range of about 150 $mA/cm^2$ to 300 $mA/cm^2$ to produce a rate of formation of porous silicon greater than about 10 microns/minute and to avoid electropolishing of the silicon; and carrying out anodic oxidation to convert the silicon into porous silicon.

28. A method according to claim 27, wherein the at least one other acid is also a surfactant.

29. A method according to claim 27, wherein the at least one other acid and is acetic acid.

30. A method according to claim 29, wherein the acetic acid is in a concentration on an order of about 5% by weight.

31. A method according to claim 27, wherein the hydrofluoric acid is in a concentration on an order of about 40% by weight.

32. A method according to claim 27, wherein at least one of a pH of the electrolyte and a value of anodic current density are selected to produce a rate of formation of porous silicon greater than about 10 microns/minute.

33. A method according to claim 27, wherein at least one of a pH of the electrolyte and a value of anodic current density is selected to produce a final porosity of less than about 70% void space.

34. A method according to claim 27, further comprising the steps of:

applying a constant anodic current for carrying out the anodic oxidation;

measuring a potential difference between first and second electrodes arranged in the electrolyte; and stopping the anodic oxidation when an increase in the potential difference is detected.

* * * * *

UNITED STATES PATENT AND TRADEMARK OFFICE
CERTIFICATE OF CORRECTION

PATENT NO. : 6,287,936 B1
DATED : September 11, 2001
INVENTOR(S) : Ernesto Perea, Guillermo Bomchil and Aomar Halimaoui It is certified that error appears in the above-identified patent and that said Letters Patent is hereby corrected as shown below:

Column 8,
Line 18, delete "other acid and is acetic acid." insert -- other acid is acetic acid --

Column 9,
Line 11, delete "claim 11," insert -- claim 17, --
Line 12, delete "other acid and is acetic acid." insert -- other acid is acetic acid. --

Column 10,
Line 17, delete "other acid and is acetic acid." insert -- other acid is acetic acid. --

Signed and Sealed this

Tenth Day of September, 2002

Attest:

Attesting Officer

JAMES E. ROGAN
*Director of the United States Patent and Trademark Office*